United States Patent
Pan

(10) Patent No.: US 6,228,674 B1
(45) Date of Patent: May 8, 2001

(54) CMOS SENSOR AND METHOD OF MANUFACTURE

(75) Inventor: Jui-Hsiang Pan, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/208,737

(22) Filed: Dec. 8, 1998

(51) Int. Cl.⁷ .................................................... H01L 21/00
(52) U.S. Cl. .............................................. 438/63; 438/197
(58) Field of Search ................................ 438/197, 199, 438/217, 282, 528, 407, 423; 257/77

(56) References Cited

U.S. PATENT DOCUMENTS 5,671,914 * 9/1997 Kalkhoran ............................ 257/77

* cited by examiner

Primary Examiner—David Nelms
Assistant Examiner—David Nhu
(74) Attorney, Agent, or Firm—Charles C. H. Wu; Charles C. H. Wu & Associates

(57) ABSTRACT

A CMOS sensor and a method of manufacturing a CMOS sensor. One major aspect of this invention is the use of a high-energy ion implantation to form a silicon nitride layer underneath the sensing region. Then, N-type dopants are implanted to form an N-type region above the silicon nitride layer within the substrate. Thereafter, a P-type epitaxial layer is formed above the substrate, thereby forming an intrinsic depletion region between the epitaxial layer and the N-doped region. The intrinsic depletion region is a light-sensitive area where light energy is converted into electrical signal. Height of the intrinsic depletion region can be adjusted through controlling the depth of the implant in the N-doped region.

13 Claims, 4 Drawing Sheets

CMOS SENSOR AND METHOD OF MANUFACTURE

BACKGROUND OF THE INVENTION

1. Field of Invention

The present invention relates to a CMOS sensor and its method of manufacture. More particularly, the present invention relates to a method of manufacturing a CMOS sensor having a P-I-N structure on a silicon-on-insulator (SOI) substrate

2. Description of Related Art

Charge coupled devices (CCDs) are often employed in digital sensors for image extraction. CCD applications include close-circuit TVs, cameras and video recorders. However, CCDs are quite costly to produce and bulky. Hence, in order to reduce volume, energy consumption and cost, CMOS photo diodes that can be formed by semiconductor techniques are a major substitute for CCDs in the future. At present, CMOS photo diodes have been used inside PC cameras and digital cameras.

A photo diode is a light-sensitive (or light-detecting) semiconductor device having a depletion region with an electric field capable of converting light energy into an electrical signal. When light rays impinge upon the depletion region, atoms within the depletion region are be activated to generate electron-hole pairs. Due to the present of a high electric field within the depletion region, electrons and holes are separated from each other. The electrons migrate towards the N-doped region while the holes migrate towards the P-doped region, thereby leading to a current flow in the intrinsic depletion region. Ideally, the photo diode should be in an open-circuit state without any electric current flow when the device is in total darkness.

As transmission speed requirements continue to increase, response time of photo diodes must also increase correspondingly. Hence, a very thin depletion layer must be maintained inside the photo diode so that transfer time is shortened. However, in order to increase quantum efficiency (that is, the number of electron-hole pairs produced by a given photon), the depletion region must be thick enough to absorb most of the incoming light. Therefore, there must be a trade-off between the thickness of the depletion layer and the response time.

Conventional photo diodes have a P-N photodiode structure. Since the depletion region is a P-N junction formed by the cross-diffusion at the interface of P-doped region and N-doped region, the thickness of the depletion region is difficult to control. Hence, after a voltage is applied to the device, the electric field within the depletion region may not be uniformly distributed.

Another type of photo diode has a P-I-N structure. Because the thickness of the intrinsic depletion region can be adjusted to secure an optimal quantum efficiency and response time, the P-I-N photo diode is one of the most commonly used light-detecting sensors.

FIG. 1 is a schematic, cross-sectional view of a conventional CMOS sensor having a stacked P-I-N structure. The P-I-N structure 102 is formed over a substrate 100. First, an epitaxial method is used to form an N-type region 104, an intrinsic depletion region 106 and a P-type region 108 in sequence on and above the substrate 100. The N-type region 104 and the P-type region 108 can be made with group III–V materials such as GaAs/AlGaAs. The N-type region 104, the intrinsic depletion region 106 and the P-type region 108 together constitute a P-I-N structure 102. A major defect of this type of manufacturing method is the high cost of performing epitaxial growth and the high cost of the group III–V materials.

To reduce the cost of production, conventional semiconductor manufacturing techniques are now employed to form a P-I-N structure. FIG. 2 is a schematic, cross-sectional view of a conventional CMOS sensor having a horizontal P-I-N structure fabricated using common semiconductor techniques. The P-I-N structure 202 is formed by performing ion implantation. P-type ions and N-type ions are implanted into different parts of a substrate 200. The two types of ions are horizontally distributed within the substrate 200, but separated from each other by a distance. An intrinsic depletion region 206 is formed between the P-doped region 208 and the N-doped region 204. The P-type region 208, the intrinsic depletion region 206 and the N-type region 204 together form the P-I-N structure 202. This type of manufacturing method, however, has difficulties in dimensional reduction, especially when a higher level of device integration is demanded. If dimensions of the photo diode are reduced, the intrinsic depletion region 206 must shrink as well. This decreases the light-sensitive area leading to a lower sensitivity.

To resolve device integration problems, another type of conventional CMOS sensor is produced. FIG. 3 is a schematic, cross-sectional view of a conventional CMOS sensor having vertical P-I-N structure embedded within a substrate. The P-I-N structure 302 is formed by performing ion implantation. First, N-type ions are implanted into the substrate 300, and then P-type ions are similarly implanted into the substrate 300 in the same location. Implantation energy level is carefully controlled so that a vertical distribution of ions as shown in FIG. 3 appears. Between the N-type and the P-type regions, an intrinsic depletion region 306 is formed. The N-type region 304, the intrinsic depletion region 306 and the P-type region 308 together form the P-I-N structure 302. Although this method is capable of producing a higher level of integration, size of the depletion region 306 is difficult to control. In other words, the patch of area in the sensitivity region is quite variable.

Furthermore, conventional CMOS sensors generally have the defect of having a short effective interaction length between incoming light and the intrinsic depletion region. Hence, the contrast ratio of the photo diodes is rather low. Taking the P-I-N structure in FIG. 3 as an example, when the incoming light passes into the intrinsic depletion region 306, a portion of the atoms within the region are be activated to create electron-hole pairs. Thereafter, an electric field within the depletion region forces the electrons and holes apart, converting light energy into electrical signals. However, the incoming light interacts with atoms in the depletion region 306 only once, and thus the effective interaction length is short. Consequently, the electrical signal generated by light activation is small, and hence the contrast ratio or sensitivity is low. Moreover, the incoming light is capable of passing through the depletion region 306 to reach the substrate 300. When the substrate 300 absorbs this stray light, unwanted current may be created leading to undesirable video effects.

In light of the foregoing, there is a need to provide an improved CMOS sensor structure and method of manufacture.

SUMMARY OF THE INVENTION

Accordingly, the present invention provides a CMOS sensor structure having an effective light-reflecting layer so that the effective interaction length of incoming light is longer, and therefore the contrast ratio and sensitivity of the CMOS sensor are higher.

In another aspect, the invention is to lower leakage current from the substrate of a CMOS sensor.

In one further aspect, the invention is to improve the uniformity of electric field in the intrinsic depletion region of a P-I-N structure.

To achieve these and other advantages and in accordance with the purpose of the invention, as embodied and broadly described herein, the invention provides a method of manufacturing a CMOS sensor on a first conductive-type substrate. The method includes the steps of forming a well of the first conductive type within a substrate, and then forming a silicon nitride layer within the well to establish a SOI structure. Thereafter, a doped region of the second conductive type is formed over the silicon nitride layer. Next, an epitaxial layer of the first conductive type is formed above the substrate in a position that corresponds to the doped region. Between the epitaxial layer and the doped region, an intrinsic depletion region is formed. In fact, the intrinsic depletion region is the CMOS sensor's light-sensitive area. Subsequently, the conductive lines and MOS are fabricated. First, a gate structure is formed above the substrate adjacent to the epitaxial layer on another part of the well. Next, source/drain region of the second conductive type is formed within the substrate on the other side of the gate structure. Finally, conductive lines are formed for connecting with the doped region.

This invention also provides a CMOS sensor structure. By forming a silicon nitride layer underneath a doped region, incoming light is able to reflect back from the silicon nitride layer after passing through the intrinsic depletion region. Therefore, the effective interaction length of incoming light is increased, and hence signal strength from light energy is further amplified. Moreover, the silicon nitride layer has one further use, that is, to prevent the penetration of light into the substrate. Hence, unwanted leakage current in the substrate is greatly reduced. Furthermore, the height of the intrinsic depletion region can be precisely controlled simply by adjusting the depth of penetration of second-type ions in the doped region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
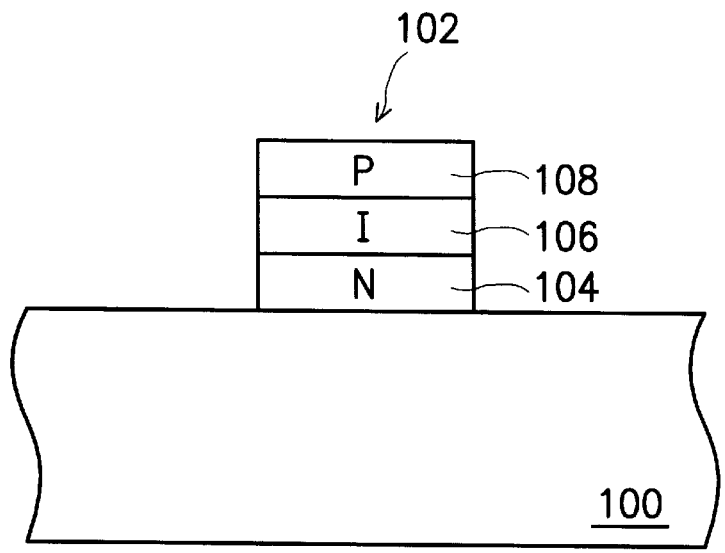
FIG. 1 is a schematic, cross-sectional view of a conventional CMOS sensor having a stacked P-I-N structure.
Figure 2:
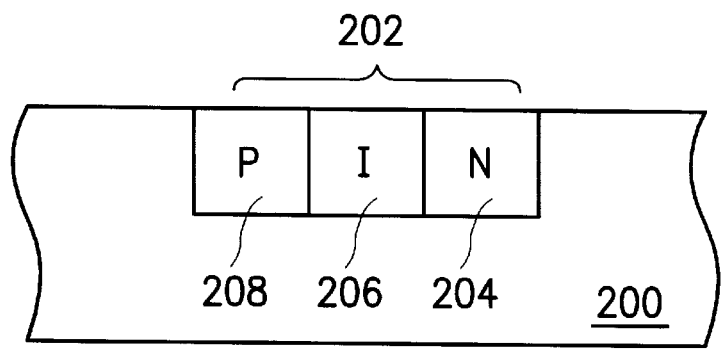
FIG. 2 is a schematic, cross-sectional view of a conventional CMOS sensor having a horizontal P-I-N structure fabricated using common semiconductor techniques.
Figure 3:
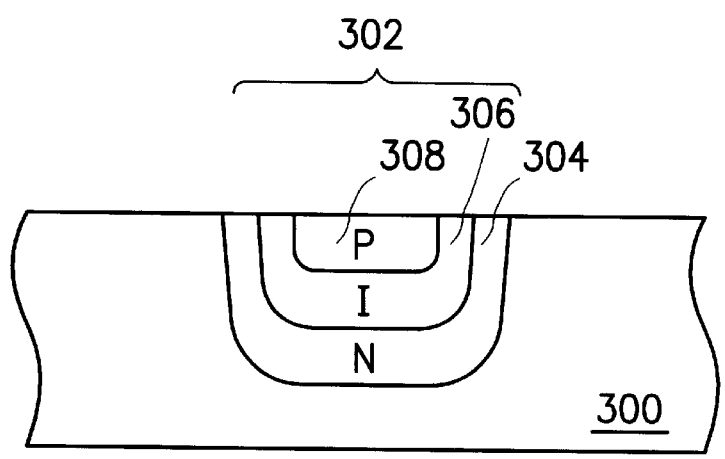
FIG. 3 is a schematic, cross-sectional view of a conventional CMOS sensor having vertical P-I-N structure embedded within a substrate.

Reference will now be made in detail to the present preferred embodiments of the invention, examples of which are illustrated in the accompanying drawings. Wherever possible, the same reference numbers are used in the drawings and the description to refer to the same or like parts.

FIGS. 4A through 4F are schematic, cross-sectional views showing the progression of manufacturing steps in producing a CMOS sensor according to one preferred embodiment of this invention.

Figure 4A:
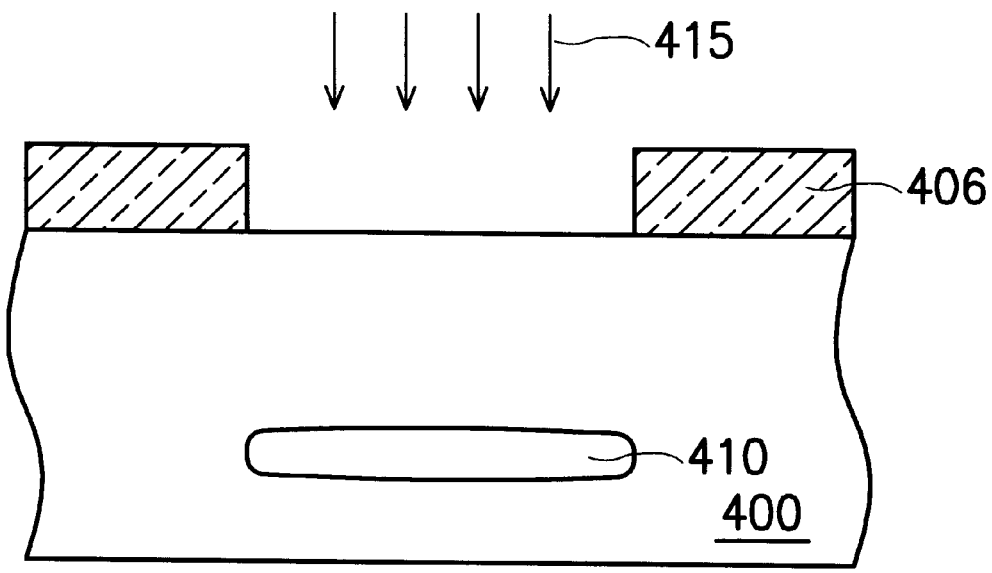
FIGS. 4A through 4F are schematic, cross-sectional views showing the progression of manufacturing steps in producing a CMOS sensor according to one preferred embodiment of this invention.
Figure 4B:
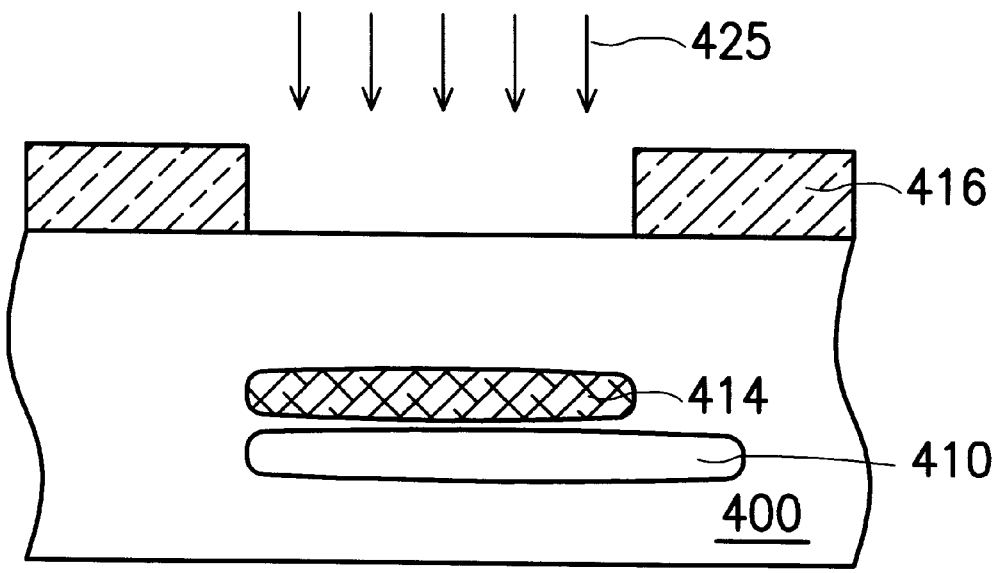

First, as shown in FIG. 4A, device isolation structures are formed on a substrate 400, for example, a P-type substrate. The device isolation structures can be field oxide (FOX) layers, shallow trench isolation structures or any other isolating structures of similar capacity (not drawn in the figure). Next, a P-well and a SOI structure are formed within the P-type substrate 400. First, a patterned photoresist layer 406 is formed, then P-type ions, for example, boron ions ($_{11}B^+$) are implanted into the substrate 400 to form a P-type ion doped region 410. Through controlling the implantation energy level of the boron implant 415, depth of penetration of the boron ions can be effectively fixed. Furthermore, by controlling the dosage level of the born implant 415, the profile of boron ions within the substrate 400 can be precisely set. In this embodiment, boron ions are implanted using an energy level of about 180 KeV, and the concentration of ions within the doped region 410 is around $7 \times 10^{12}$ ions/cm$^2$.

Next, a silicon-on-insulator (SOI) structure is formed. The method of fabricating a SOI structure includes forming a layer of insulating material, preferably silicon nitride, at a distance below the upper surface of the substrate 400. Details of the method have been disclosed in an article by Bourguet et al in J. Appl. Phys. 51(12), pp 6169–6175. In this invention, a SOI structure using silicon nitride as the insulating layer is applied to fabricate a CMOS sensor. The method of forming a SOI structure with silicon nitride as the insulating layer is briefly described below.

First, a photoresist layer 416 is formed over the semiconductor substrate 400 (since the original photoresist layer 406 covers the same region as the photoresist layer 416 is required, photoresist layer 406 need not be removed, instead the photoresist layer 416 can be directly deposited). The photoresist layer 416 exposes areas where the silicon nitride layer of the SOI structure is located. Thereafter, using the photoresist layer 416 as a mask, nitrogen ions are implanted into the substrate 400 at a temperature of about 500° C. to form a nitrogen-doped region 414. The nitrogen implant 425 is carried out using an energy level of about 180 KeV with an implantation concentration of about $1 \times 10^{18}$ ions/cm$^2$. After the completion of nitrogen implant 425, the photoresist layer 416 is removed.

Figure 4C:
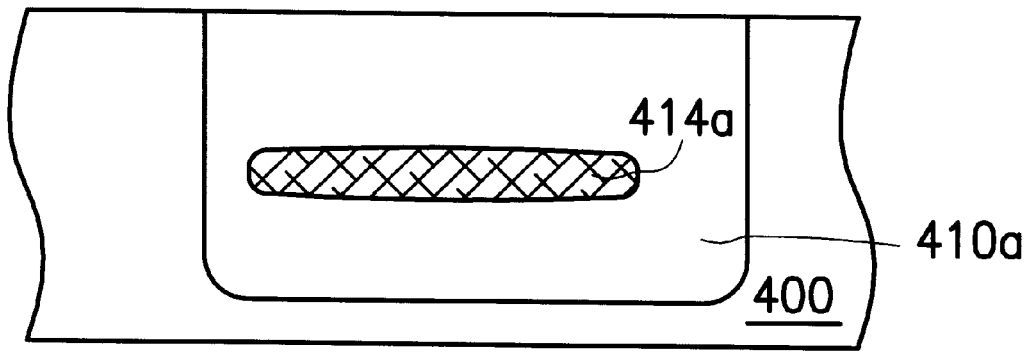

Next, as shown in FIG. 4C, an annealing operation is carried out by heating the substrate 400 to about 1200° C. for two hours. After the annealing operation, the nitrogen implanted inside the nitrogen-doped region 414 is not only more uniformly spread out, but also reacts with silicon to form an insulating silicon nitride layer 414a. On the other hand, the boron-doped region 410 is turned into a P-well 410a, wherein the newly formed silicon nitride layer 414a is embedded within the P-well 410a. The silicon nitride layer 414a has a refraction index of about 2.05. The silicon nitride layer 414a in the interior of the semiconductor substrate 400 is one of the characteristic formations in this invention. The silicon nitride layer 414a turns the substrate into a SOI structure. This structure can serve as a reflecting layer in the sensing area of the CMOS photo diode.

Figure 4D:
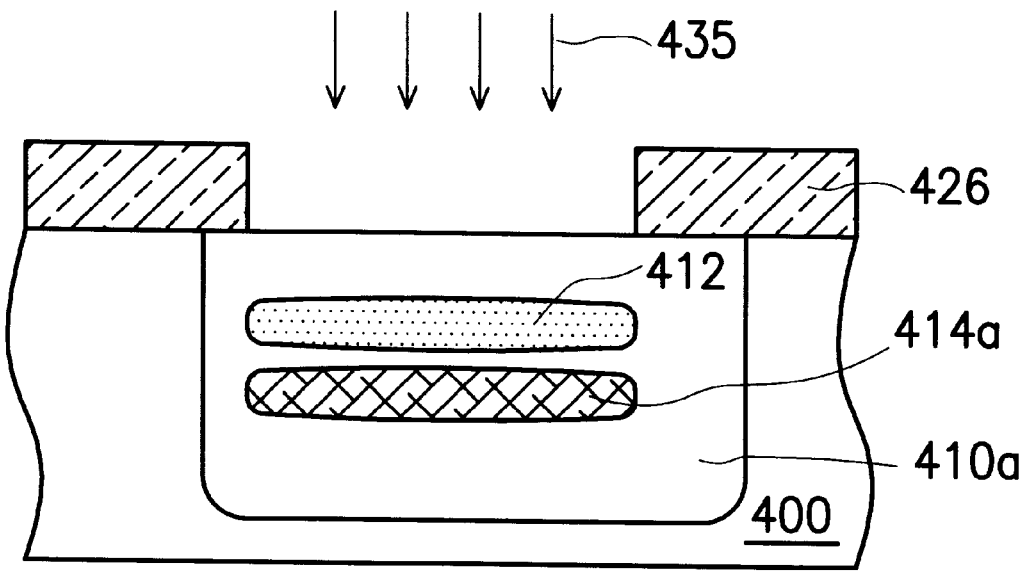

Next, as shown in FIG. 4D, a photoresist layer 426 is formed over the substrate 400. The photoresist layer 426 exposes the areas requiring N-type ion implant. Then, an ion implantation of group V ions, for example, arsenic (As) ions, is carried out using the photoresist layer 426 as a mask at a temperature of about 500° C. Thereafter, the substrate 400 is annealed by heating to about 900° C. in a nitrogen atmosphere to form an N-doped region 412 within the substrate 400. By controlling the energy level used in the arsenic ion implant 435, the depth of the arsenic ion implant can be effectively fixed. By controlling the dosage in the arsenic ion implant 435, the profile of arsenic ions inside the substrate 400 can be precisely set. In this embodiment, arsenic ions are implanted using an energy level of about 180 KeV, and the concentration of ions within the doped region 412 is around $1 \times 10^{16}$ ions/cm$^2$. After the implantation is complete, the photoresist layer 426 is removed.

In addition, processes for forming device isolation structures (not shown in the figure) can be conducted before the arsenic implant 435.

Figure 4E:
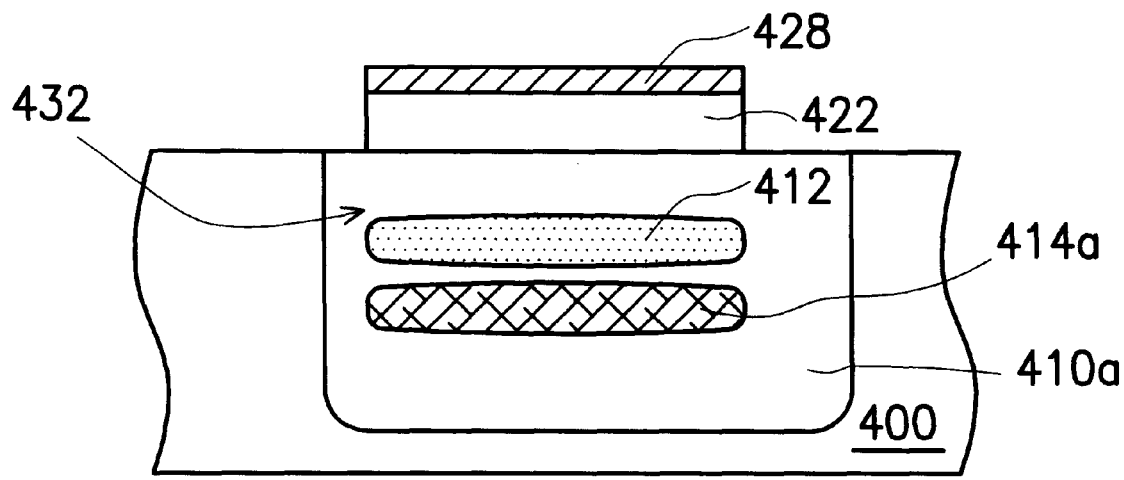

Next, as shown in FIG. 4E, a P-type epitaxial layer 422 is formed on the substrate 400, thereby forming an intrinsic depletion region 432 between the P-type epitaxial layer 422 and the N-doped region 412. The depletion region 432 is the site for converting light energy into current signal. The refractive index in the depletion region 432 is higher than the subsequently formed dielectric passivation layer above and the silicon nitride layer 414a below. Thereafter, an anti-reflection coating (ARC) 428 is formed (shown in the figure) over the P-type epitaxial layer 422. Alternately, the above step may be skipped. When the anti-reflection coating 428 is present, less incoming light is reflected back. Therefore, a greater percentage of light passes into the substrate and a larger current is generated, hence making the photo diode more sensitive to light.

Since the depth of the N-doped region 412 can be easily adjusted and the P-type epitaxial layer 422 can be formed above the substrate surface, depth of the intrinsic depletion region 432 can be controlled by raising or lowering the depth of the N-doped region 412 below the substrate surface. The precise control of depletion depth represents another important characteristic of this invention.

Furthermore, since the intrinsic depletion region 432 is located within the P-well 410a, unlike the conventional depletion region formed by the cross-diffusion between a P-type and an N-type region, charges within the intrinsic depletion region 432 can be efficiently controlled. Consequently, the electric field within the intrinsic depletion region (or the P-N junction) is uniform. The uniform distribution of electric field within the depletion region is yet another important characteristic of this invention.

Figure 4F:
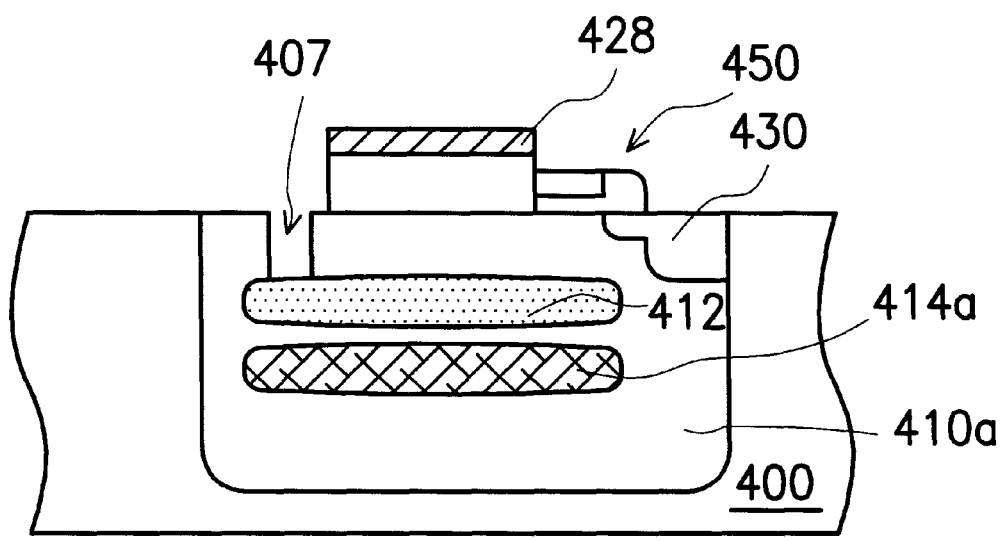

Next, as shown in FIG. 4F, a conventional method is used to form a gate structure 450 above the semiconductor substrate 400. Thereafter, a source/drain region 430 having a lightly doped drain (LDD) structure is formed within the substrate 400. After that, an opening 407 that exposes a portion of the N-doped region 412 is formed using a technique for forming shallow trench isolation structure. Finally, conductive material is deposited into the opening 407, thereby forming conductive lines (not drawn in the figure) having electrical connection with the N-doped region 412.

Lastly, a dielectric passivation layer is formed over the entire substrate surface (not drawn in the figure). Preferably, the passivation layer is a borophosphosilicate glass (BPSG)/silicon nitride glass (SN glass) layer or similar materials. Thereafter, an anisotropic dry etching is carried out to expose the regions where conductive lines are desired. The dielectric passivation layer normally has a refractive index of about 1.46.

When the depletion region is activated by photons, electrons-hole pairs are generated in the depletion region 432. Under the influence of an electric field, the electrons and the holes move in opposite direction, and hence generating an electric current in the depletion region. In other words, an electronic device capable of converting light energy into an electric current is formed. Since the depletion region 432 and the substrate 400 have a refractive index greater than the refractive index of the silicon nitride passivation layer, incoming light will be reflected back after impinging on the silicon nitride layer 414a. With this setup, light travels on a longer path, and therefore the effective interaction length is increased. Consequently, the electric signal is significantly amplified.

In addition, since it is very difficult for light to penetrate through the silicon nitride layer 414a, the chance of light hitting the semiconductor substrate 400 followed by absorption is small. Therefore, problems caused by substrate leakage are greatly reduced.

Since the CMOS sensor structure disclosed in this invention is capable of reducing substrate leakage and increasing light reflection through a reflecting buffer layer, light to electric signal can be substantially magnified. Hence, the on/off ratio of the CMOS sensor and hence the contrast ratio is increased. In other words, the sensitivity of the CMOS sensor is considerably improved.

In summary, characteristics of this invention include the following:

1. The CMOS sensor structure of this invention has a reflecting layer underneath the P-I-N structure so that incoming light has a longer effective interaction length. Therefore, a given incoming light beam is able to produce a larger electrical signal.

2. Since the CMOS sensor of this invention has a reflecting layer underneath the P-I-N structure, it is very difficult for light to penetrate through the reflecting layer into the substrate. Consequently, leakage current from the substrate is greatly reduced.

3. Because depth of the N-doped region 412 beneath the substrate surface can be easily controlled while the P-type epitaxial layer is formed above the substrate surface, depth of the intrinsic depletion region 432 can be easily adjusted by the careful setting of the depth of the N-doped region 412.

4. The intrinsic depletion region 432 of the CMOS sensor is embedded within the P-well 410a, which is different from a depletion region formed by the cross-diffusion of P-type and N-type regions in a conventional sensor. Hence, charges within the depletion region 432 can be effectively controlled, and a uniform distribution of electric field is achieved.

5. When the CMOS sensor of this invention is used for the extraction of images, a very high contrast ratio and sensitivity can be obtained.

6. Processes used in fabricating the CMOS sensor are compatible with current semiconductor manufacturing methods, and hence cost of production is low and can be implemented quite readily.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a CMOS sensor, comprising the steps of:

providing a substrate of a first conductive type;

forming a silicon nitride layer inside the substrate;

forming a doped region of a second conductive type inside the substrate above the silicon nitride layer;

forming an epitaxial layer of the first conductive type over the substrate above the doped region;

forming a gate structure adjacent to the epitaxial layer above the substrate;

forming a source/drain region of the second conductive type in the substrate on one side of gate structure; and forming a conductive line that connects with the doped region.

2. The method of claim 1, wherein before the step of forming the silicon nitride layer within the substrate, further includes forming a device isolation region in the substrate.

3. The method of claim 1, wherein before the step of forming the doped region within the substrate, further includes forming a device isolation region in the substrate.

4. The method of claim 1, wherein the first conductive type and the second conductive type are materials doped with ions of the opposite polarity.

5. The method of claim 1, wherein the first conductive type includes P-doped material.

6. The method of claim 1, wherein the second conductive type includes N-doped material.

7. The method of claim 1, wherein the step of forming the silicon nitride layer includes implanting nitrogen ions into the substrate at a temperature of about 500° C. using an energy of about 180 KeV and an implantation concentration of about $1 \times 10^{18}$ ions/cm$^2$, and then annealing the substrate at a temperature of about 2000° C. for two hours.

8. The method of claim 1, wherein after the step of forming the epitaxial layer, further includes depositing an anti-reflection layer above the epitaxial layer.

9. A method of manufacturing P-I-N structure, comprising the steps of:

providing a substrate of the first conductive type;

forming a silicon nitride layer inside the substrate;

forming a doped region of the second conductive type inside the substrate above the silicon nitride layer; and forming an epitaxial layer of the first conductive type over the substrate above the doped region so that an intrinsic depletion region is formed between the epitaxial layer and the doped region, wherein the epitaxial layer, the intrinsic depletion region and the doped region together constitute a P-I-N structure.

10. A method of manufacturing CMOS sensor for substrate of the first conductive type, comprising the steps of:

forming a well of the first conductive type within the substrate;

forming a silicon nitride layer within a portion of the well;

forming a doped region of the second conductive type over the silicon nitride layer within the well;

forming an epitaxial layer of the first conductive type over the substrate above a portion of the doped region;

forming a gate structure above the substrate adjacent to the epitaxial layer on another region of the well;

forming a source/drain region of the second conductive layer in the substrate on one side of the gate structure; and forming a conductive line that connects electrically with the doped region, wherein the region between the epitaxial layer and the doped region is a sensing area in the CMOS sensor.

11. The method of claim 10, wherein the first conductive type and the second conductive type are materials doped with ions of the opposite polarity.

12. The method of claim 10, wherein the step of forming the silicon nitride layer includes implanting nitrogen ions into the substrate at a temperature of about 500° C. using an energy of about 180 KeV and an implantation concentration of about $1 \times 10^{18}$ ions/cm$^2$, and then annealing the substrate at a temperature of about 2000° C. for two hours.

13. The method of claim 10, wherein after the step of forming the epitaxial layer, further includes depositing an anti-reflection layer above the epitaxial layer.

* * * * *